United States Patent
Hung et al.

(10) Patent No.: US 9,478,644 B1
(45) Date of Patent: Oct. 25, 2016

(54) SEMICONDUCTOR DEVICE

(71) Applicant: VANGUARD INTERNATIONAL SEMICONDUCTOR CORPORATION, Hsinchu (TW)

(72) Inventors: Pei-Heng Hung, New Taipei (TW); Manoj Kumar, Dhanbad (IN); Hsiung-Shih Chang, Taichung (TW); Chia-Hao Lee, New Taipei (TW); Jui-Chun Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/886,646

(22) Filed: Oct. 19, 2015

(51) Int. Cl.
| | |
|---|---|
| H01L 29/66 | (2006.01) |
| H01L 29/02 | (2006.01) |
| H01L 27/108 | (2006.01) |
| H01L 29/786 | (2006.01) |
| H01L 29/73 | (2006.01) |
| H01L 29/08 | (2006.01) |
| H01L 29/10 | (2006.01) |
| H01L 27/12 | (2006.01) |

(52) U.S. Cl.
CPC ....... H01L 29/7302 (2013.01); H01L 27/1203 (2013.01); H01L 29/0804 (2013.01); H01L 29/0821 (2013.01); H01L 29/0834 (2013.01); H01L 29/0839 (2013.01); H01L 29/1004 (2013.01)

(58) Field of Classification Search
CPC ............ H01L 29/7302; H01L 27/1203; H01L 29/0804; H01L 29/0821; H01L 29/0834; H01L 29/0839; H01L 29/1004
USPC ....... 257/358, 560, 296, 354, 357, 774, 170, 257/306, 347, 501, E21.549, 355, 329, 618, 257/E27.001, E29.262; 438/424, 371, 268
See application file for complete search history.

(56) References Cited

U.S. PATENT DOCUMENTS

| | | | | |
|---|---|---|---|---|
| 5,801,420 | A | * 9/1998 | Fujishima | ........... H01L 29/0634 257/133 |
| 2004/0129983 | A1 | * 7/2004 | Mallikarjunaswamy | H01L 29/49 257/370 |
| 2005/0036252 | A1 | * 2/2005 | Hu | ........ H01L 27/0259 361/56 |
| 2011/0057256 | A1 | * 3/2011 | Sasaki | ........ H01L 29/0615 257/329 |
| 2012/0273871 | A1 | * 11/2012 | Yedinak | ........ H01L 29/872 257/329 |

FOREIGN PATENT DOCUMENTS

TW      2008-28496 A      7/2008

* cited by examiner

*Primary Examiner* — Dzung Tran
(74) *Attorney, Agent, or Firm* — Birch, Stewart, Kolasch & Birch, LLP

(57) ABSTRACT

The invention provides a semiconductor device, including a buried oxide layer disposed on a substrate. A semiconductor layer having a first conduction type is disposed on the buried oxide layer. A first well region having the first conduction type is disposed in the semiconductor layer. A second well and a third well having a second conduction type are disposed to opposite sides of the first well region. The second well and the third well are separated from the first well region. A first anode doped region is disposed in the second well. A second anode doped region and a third anode doped region having the first conduction type are disposed in the second well. The second anode doped region is positioned directly on the third anode doped region. A first cathode doped region is coupled to the third well.

24 Claims, 13 Drawing Sheets

US 9,478,644 B1

SEMICONDUCTOR DEVICE

BACKGROUND OF THE INVENTION

1. Field of the Invention

The present invention relates to a semiconductor device, and in particular to a fast recovery diode.

2. Description of the Related Art

In fast recovery diodes, the majority of carriers of the current pass through the channel region under forward voltage conditions, and reverse recovery time (tRR), which is the time for turning the diode off and taking the minority carriers completely out, is reduced while maintaining soft-recovery properties under reverse voltage conditions. However, the higher the voltage that the fast recovery diodes can endure, the longer the reverse recovery time (tRR) that the fast recovery diodes can take.

Thus, a novel fast recovery diode with large forward current, short reverse recovery time, large reverse recovery softness factor and high-voltage endurance is desirable.

BRIEF SUMMARY OF THE INVENTION

A semiconductor device is provided. An exemplary embodiment of a semiconductor device includes a substrate. A buried oxide layer is disposed on the substrate. A semiconductor layer having a first conduction type is disposed on the buried oxide layer. A first well doped region having the first conduction type is disposed in the semiconductor layer. A second well doped region and a third well doped region having a second conduction type are disposed close to opposite sides of the first well doped region. The second well doped region and the third well doped region are separated from the first well region by a first distance and a second distance. A first anode doped region having the second conduction type is disposed in the second well doped region. A second anode doped region having the first conduction type is disposed in the second well doped region. A third anode doped region having the first conduction type is disposed in the second well doped region. The second anode doped region is positioned directly on third anode doped region. A first cathode doped region having the second conduction type is coupled to the third well doped region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
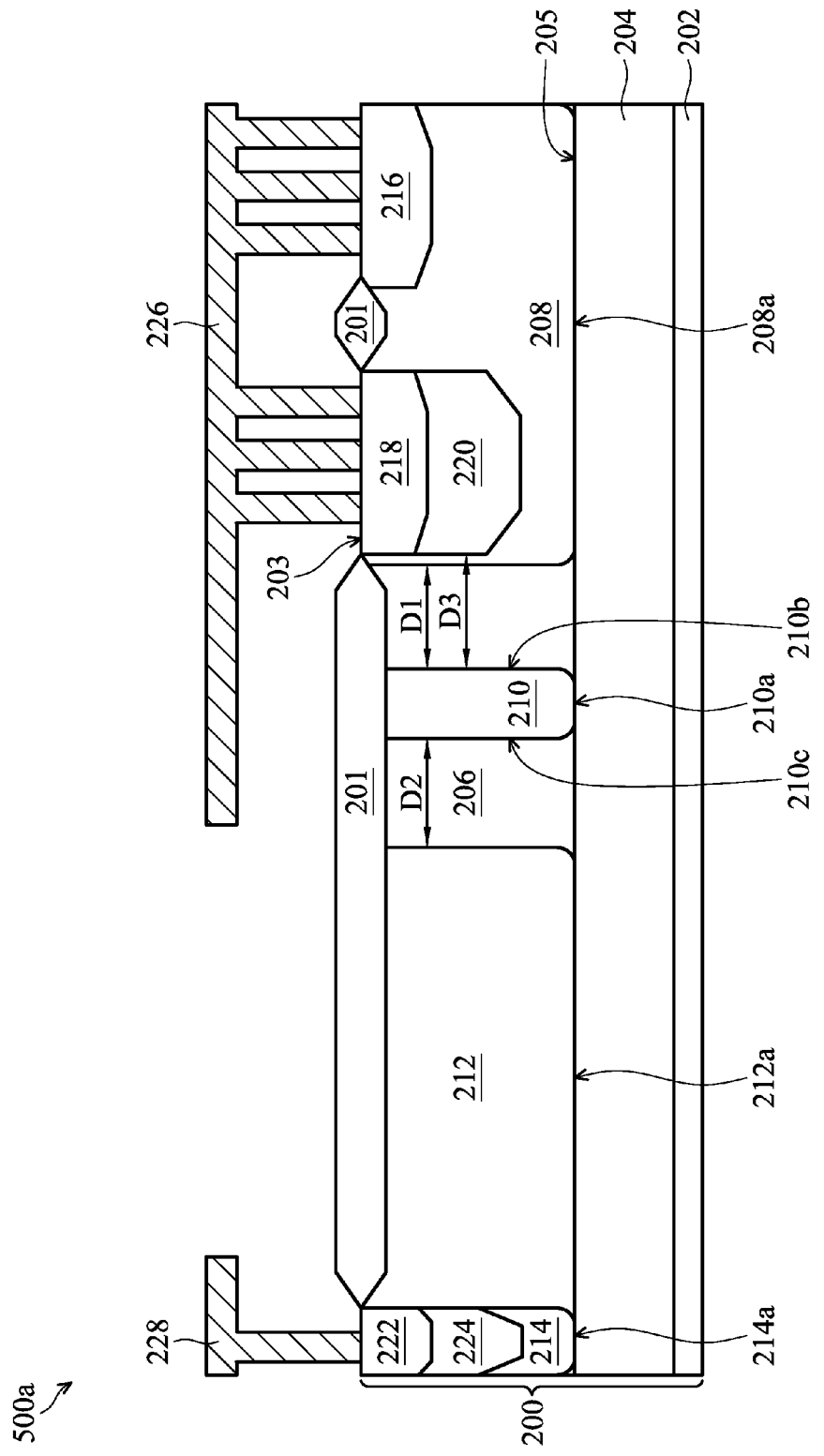
FIG. 1A is a cross-sectional view of a semiconductor device in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor device. In some embodiments, the semiconductor is a lateral fast recovery diode. The lateral fast recovery diode utilizes a design concept of a lateral bipolar junction transistor (lateral BJT). The area of the device can be significantly reduced and the driving ability of the current is increased. The semiconductor device is formed on a silicon-on-insulator (SOI) substrate, thereby compressing the latch-up effect generated by a parasitic bipolar junction transistor (BJT). The SOI substrate can further suppress the latch-up effect occurring to protect the semiconductor device. Also, the SOI substrate can suppress the leakage current of the semiconductor device.

Figure 1B:
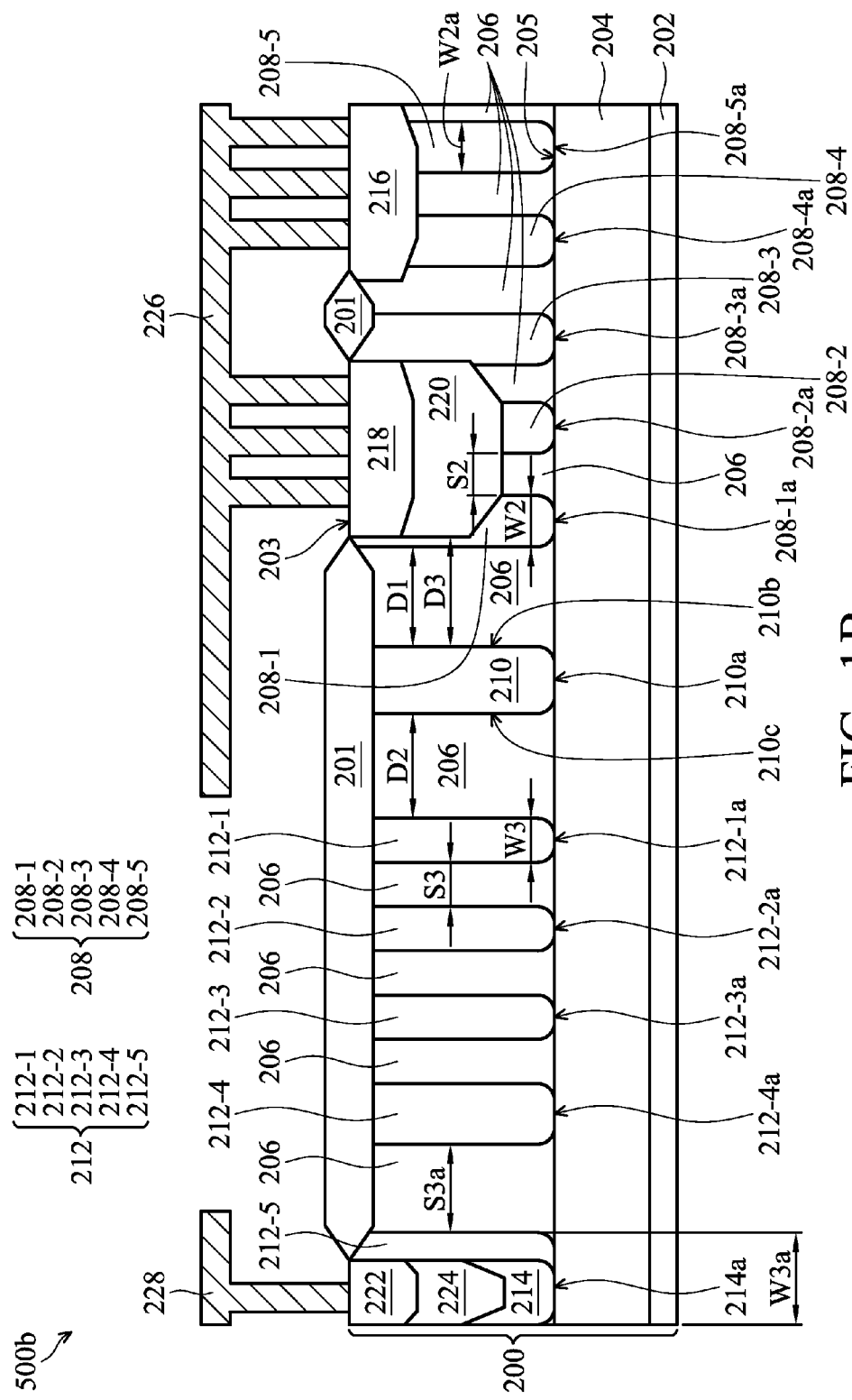
FIG. 1B is a cross-sectional view of a semiconductor device in accordance with some embodiments of the disclosure.
Figure 1C:
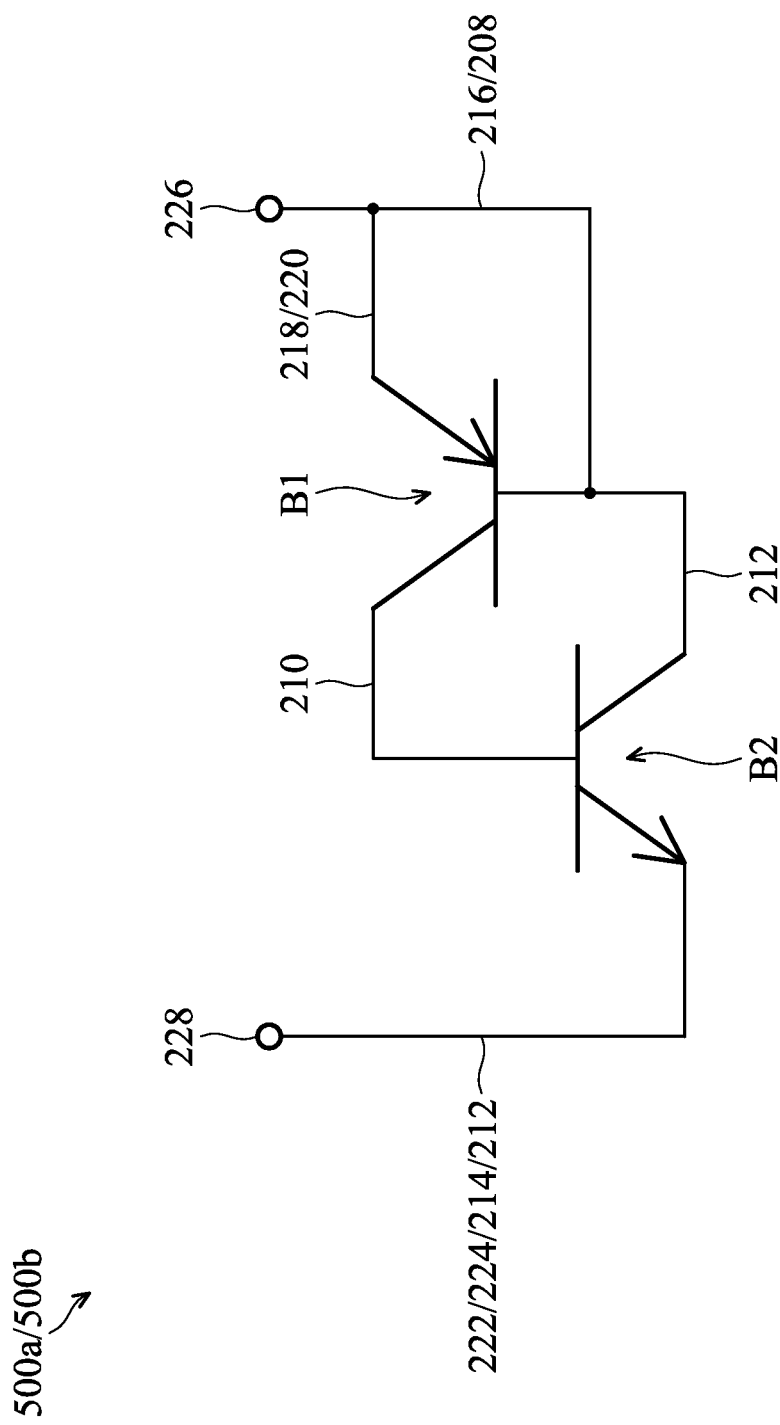
FIG. 1C is an equivalent circuit diagram shown in FIGS. 1A and 1B.

FIGS. 1A and 1B are cross-sectional views of semiconductor devices 500a and 500b in accordance with some embodiments of the disclosure. FIG. 1C is an equivalent circuit diagram shown in FIGS. 1A and 1B.

As shown in FIG. 1A, the semiconductor device 500a in accordance with some embodiments of the disclosure includes a SOI substrate 200. In some embodiments, the SOI substrate 200 includes a substrate 202, a buried oxide layer 204 and a semiconductor layer 206. The buried oxide layer 204 is disposed on the substrate 202, and the semiconductor layer 206 is disposed on the buried oxide layer 204. The semiconductor layer 206 of the SOI substrate 200 has a first conduction type, and the substrate 202 has a second conduction type opposite to the first conduction type. The substrate 202 and the semiconductor layer 206 are separated from each other through the buried oxide layer 204. For example, the substrate 202 is an n-type substrate, and the semiconductor layer 206 is a p-semiconductor layer. In some embodiments, the thickness of the SOI substrate 200 may be in a range of about 2 µm-5 µm, the thickness of the buried oxide layer 204 may be in a range of about 0.4 µm-3.5 µm.

As shown in FIG. 1A, the semiconductor device 500a includes a first well doped region 210, a second well doped region 208 and a third well doped region 212 disposed in the semiconductor layer 206 and laterally separated from each other. The first well doped region 210 has the first conduction type. The second well doped region 208 and the third well doped region 212 having the second conduction type are respectively close to opposite sides of the first well doped region 210. The second well doped region 208 and the third well doped region 212 are respectively separated from the sides 210b and 210c of the first well doped region 210 by a first distance D1 and a second distance D2. For example, the first well doped region 210 is a high-voltage p-well (HVPW) doped region. Also, the concentration of the first well doped region 210 is greater than that of the semiconductor layer 206. In some embodiments, the first distance D1 is equal to or less than the second distance D2. In some embodiments, a bottom boundary 210a of the first well doped region 210, a bottom boundary 208a of the second well doped region 208 and a bottom boundary 212a of the third well doped region 212 may be in contact with an interface 205 of the semiconductor layer 206 and the buried oxide layer 204. In some other embodiments, the bottom boundary 210a of the first well doped region 210, the bottom boundary 208a of the second well doped region 208 and the bottom boundary 212a of the third well doped region 212 may be separated from the interface 205 of the semiconductor layer 206 and the buried oxide layer 204 through the semiconductor layer 206.

As shown in FIG. 1A, the semiconductor device 500a includes one or more isolation features 201 formed on the surface 203 of the semiconductor layer 206. The isolation features 201 may be used to define an active region of the semiconductor device 500a. As shown in FIG. 1A, one of the isolation features 201 is formed extending from a side boundary of the third well doped region 212, which is away from the first well doped region 210, to a side boundary of the second well doped region 208, which is close to the first well doped region 210. One of the isolation features 201 covers the first well doped region 210 and the third well doped region 212, so that the first well doped region 210 and the third well doped region 212 are positioned directly below the isolation feature 201. Another isolation feature 201 covers a portion of the second well doped region 208, so that formation positions of a subsequent anode doped region formed therein are defined. In some embodiments, the isolation feature 201 covering the portion of the second well doped region 208 is not formed. In some embodiments, the isolation features 201 may comprise local oxidation of silicon (LOCOS) features or shallow trench isolation (STI) features.

As shown in FIG. 1A, a first anode doped region 216, a second anode doped region 218 and a third anode doped region 220 are disposed in the second well doped region 208. The first anode doped region 216 has the second conduction type, and the second anode doped region 218 has the first conduction type. The second anode doped region 218 may be laterally separated from the first anode doped region 216 by a distance through the isolation feature 201. The third anode doped region 220 has the first conduction type. Also, the second anode doped region 218 is formed directly on and connected to the third anode doped region 220. Also, bottom boundaries of the second anode doped region 218 and the third anode doped region 220 are separated from the buried oxide layer 204. Furthermore, the second anode doped region 218 is separated from the first well doped region 210 by a third distance D3. In this embodiment, the second anode doped region 218 is formed within a boundary of the second well doped region 208, so the third distance D3 is greater than the first distance D1. In some embodiments, the dopant concentration of the first anode doped region 216 is greater than that of the second well doped region 208. The dopant concentration of the second anode doped region 218 is greater than that of the third anode doped region 220. Also, the dopant concentration of the third anode doped region 220 is greater than that of the first well doped region 210. For example, the first anode doped region 216 is an n-type heavily (N$^+$) doped region, the second anode doped region 218 is a p-type heavily (P$^+$) doped region, and the third anode doped region 220 is a p-type lightly doped source/drain (PLDD) region. Additionally, the first anode doped region 216, the second anode doped region 218 and the third anode doped region 220 are collectively coupled to an anode electrode 226.

As shown in FIG. 1A, the semiconductor device 500a includes a fourth well doped region 214 having the second conduction type. A dopant concentration of the fourth well doped region 214 is greater than that of the third well doped region 212. For example, the fourth well doped region 214 is an n-type well (NW) doped region. The fourth well doped region 214 is adjacent to a side of the third well doped region 212, which is away from the first well doped region 210. In other words, the fourth well doped region 214 is separated from the first well doped region 210 through at least the third well doped region 212. In some embodiments, a bottom boundary 214a of the fourth well doped region 214 is in contact with the interface 205 of the semiconductor layer 206 and the buried oxide layer 204. The fourth well doped region 214 is exposed from the isolation features 201.

As shown in FIG. 1A, a first cathode doped region 222 and a second cathode doped region 224, which have the second conduction type, are disposed on the fourth well doped region 214. Also, the first cathode doped region 222 is positioned directly on the second cathode doped region 224. The dopant concentration of the first cathode doped region 222 is greater than that of the second cathode doped region 224. For example, the first cathode doped region 222 is an n-type heavily (N$^+$) doped region, the second cathode doped region 224 is an n-type lightly doped source/drain (NLDD) region. The first cathode doped region 222 and the second cathode doped region 224 are coupled to a cathode electrode 228. Also, the first cathode doped region 222 is coupled to the third well doped region 212 through the second cathode doped region 224 and the fourth well doped region 214.

FIG. 1B is a cross-sectional view of a semiconductor device 500a in accordance with some embodiments of the disclosure. One of the differences between the semiconductor device 500b and the semiconductor device 500a is that the second well doped region 208 and the third well doped region 212 of the semiconductor device 500b are respectively composed by a plurality of strip-shaped sub-well doped regions separated from each other. As shown in FIG. 1B, the second well doped region 208 of the semiconductor device 500b is composed by a plurality of strip-shaped second sub-well doped regions 208-1, 208-2, 208-3, 208-4 and 208-5 separated from each other. The second sub-well doped regions 208-1-208-5 extend from a surface 203 of the semiconductor layer down to the buried oxide layer 204. The third well doped region 212 of the semiconductor device 500b is composed by a plurality of strip-shaped third sub-well doped regions 212-1, 212-2, 212-3, 212-4 and 212-5 separated from each other. The third sub-well doped regions 212-1-212-5 extend from the surface 203 of the semiconductor layer down to the buried oxide layer 204. Compared with the second well doped region 208 and the third well doped region 212 of the semiconductor device 500a, the second well doped region 208 and the third well doped region 212 of the semiconductor device 500b are respectively composed by a plurality of strip-shaped sub-well doped regions, so that the total dopant concentrations of the second well doped region 208 and the third well doped region 212 can be reduced. It should be noted that the number of strip-shaped second sub-well doped regions and of strip-shaped third sub-well doped regions are defined according to the design, but they are not limited to the disclosed embodiments.

As shown in FIG. 1B, the width W2 of the strip-shaped second sub-well doped region 208-1, which is close to the first well doped region 210, may be designed to be smaller than the width W2a of the strip-shaped second sub-well doped region 208-5, which is farther away from the first well doped region 210 than the strip-shaped second sub-well doped regions 208-1-208-4. The strip-shaped second sub-well doped region 208-1, which is close to the first well doped region 210, is separated from the adjacent strip-shaped second sub-well doped region 208-2 by a space S2. The space S2 may be designed to be greater than the width W2 of the strip-shaped second sub-well doped region 208-1 and the width W2a of the strip-shaped second sub-well doped region 208-5.

As shown in FIG. 1B, the width W3 of the strip-shaped third sub-well doped region 212-1, which is close to the first well doped region 210, may be designed to be smaller than the width W3a of the strip-shaped third sub-well doped region 212-5, which is farther away from the first well doped region 210 than the strip-shaped third sub-well doped regions 212-1-212-4. The strip-shaped third sub-well doped region 212-1, which is close to the first well doped region 210, is separated from the adjacent strip-shaped third sub-well doped region 212-2 by a space S3. The strip-shaped third sub-well doped region 212-5, which is close to the fourth well doped region 214, is separated from the adjacent strip-shaped third sub-well doped region 212-4 by a space S3a. The space S3 may be designed to be greater than the width W3 of the strip-shaped third sub-well doped region 212-1. The space S3a may be designed to be greater than the width W3a of the strip-shaped third sub-well doped region 212-5. Also, the space S3 may be designed to be smaller than the space S3a.

FIG. 1C is an equivalent circuit diagram of the semiconductor devices 500a and 500b in accordance with some embodiments of the disclosure shown in FIGS. 1A and 1B. As shown in FIGS. 1A and 1C, the first anode doped region 216, the second anode doped region 218, the third anode doped region 220, the second well doped region 208 and the first well doped region 210 of the semiconductor device 500a or the semiconductor device 500b collectively form a first bipolar junction transistor B1. The second anode doped region 218 and the third anode doped region 220 serve as a collector of the first bipolar junction transistor B1. The first anode doped region 216 and the second well doped region 208 serve as a base of the first bipolar junction transistor B1. Also, the first well doped region 210 serves as an emitter of the first bipolar junction transistor B1.

As shown in FIGS. 1A and 1C, the first anode doped region 216, the second well doped region 208, the first well doped region 210, the third well doped region 212, the fourth well doped region 214, the first cathode doped region 222 and the second cathode doped region 224 of the semiconductor device 500a or the semiconductor device 500b collectively form a second bipolar junction transistor B2. The first anode doped region 216 and the second well doped region 208 serve as a collector of the second bipolar junction transistor B2. The first well doped region 210 serves as a base of the second bipolar junction transistor B2. The third well doped region 212, the fourth well doped region 214, the first cathode doped region 222 and the second cathode doped region 224 serve as an emitter of the second bipolar junction transistor B2. The base of the first bipolar junction transistor B1 is coupled to the collector of the second bipolar junction transistor B2. Also, the emitter of the first bipolar junction transistor B1 is coupled to the collector of the second bipolar junction transistor B2. The first bipolar junction transistor B1 and the second bipolar junction transistor B2 are both lateral bipolar junction transistors (BJTs). In some embodiments, when the first conduction type is p-type, and the second conduction type is n-type, the first bipolar junction transistor B1 may serve as a PNP bipolar junction transistor, and the second bipolar junction transistor B2 may serve as a NPN bipolar junction transistor. Therefore, the first anode doped region 216, the second anode doped region 218, the third anode doped region 220, the first well doped region 210, the second well doped region 208, the third well doped region 212, the fourth well doped region 214, the first cathode doped region 222 and the second cathode doped region 224 of the semiconductor device 500a or the semiconductor device 500b may collectively form a diode. The second anode doped region 218, the third anode doped region 220, the first well doped region 210, which are coupled to the anode electrode 226, may serve as a first electrode of the diode. The third well doped region 212, the fourth well doped region 214, the first cathode doped region 222 and the second cathode doped region 224, which are coupled to the cathode electrode 228, may serve as a second electrode of the diode. In some embodiments, when the first conduction type is p-type, and the second conduction type is n-type, the second anode doped region 218, the third anode doped region 220, the first well doped region 210, which are coupled to the anode electrode 226, may serve as an anode (p-electrode) of the diode. The third well doped region 212, the fourth well doped region 214, the first cathode doped region 222 and the second cathode doped region 224, which are coupled to the cathode electrode 228, may serve as a cathode (n-electrode) of the diode.

Figure 3:
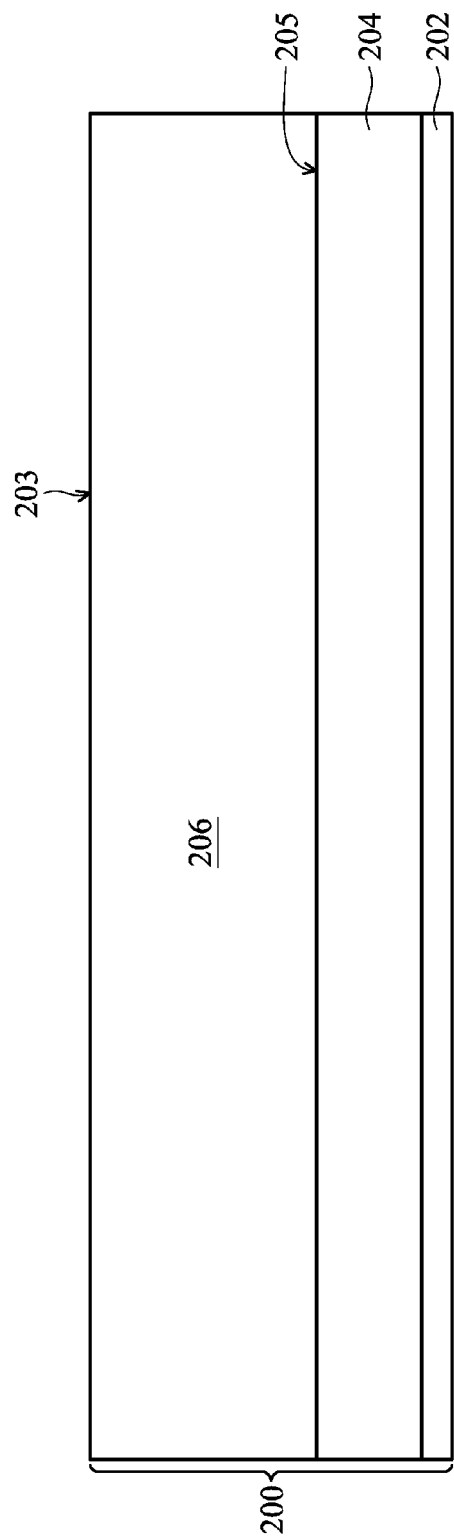
FIG. 3 is cross-sectional views showing a method for fabricating a semiconductor device in accordance with some embodiments of the disclosure.

FIGS. 3-7 and 8A are cross-sectional views showing a method for fabricating the semiconductor device 500a in accordance with some embodiments of the disclosure. As shown in FIG. 3, a silicon on insulator (SOI) substrate 200 is provided. The SOI substrate 200 includes the substrate 202, the buried oxide layer 204 vertically laminating on the substrate 202, and the semiconductor layer 206 vertically laminating on the buried oxide layer 204. For example, the substrate 202 may be an n-type substrate, and the semiconductor layer 206 is a p-type semiconductor layer. Also, the substrate 202 and the semiconductor layer 206 are separated from each other through the buried oxide layer 204.

Figure 4:
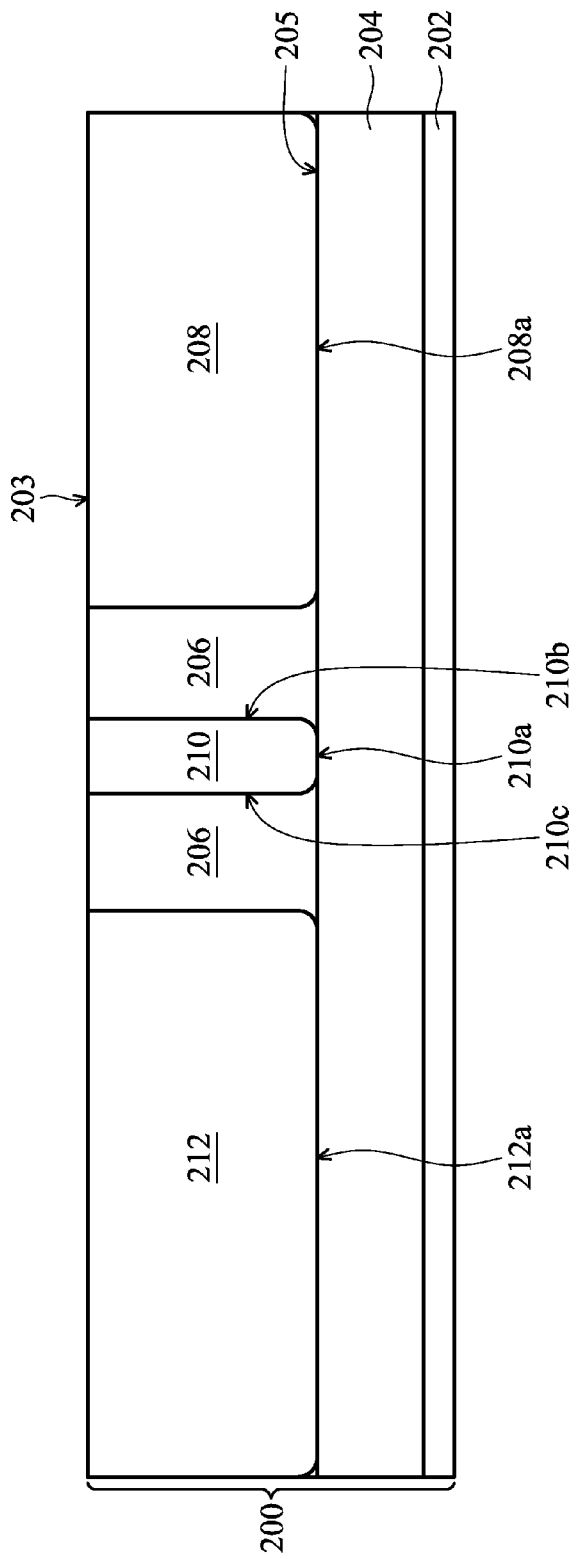
FIG. 4 is cross-sectional views showing a method for fabricating a semiconductor device in accordance with some embodiments of the disclosure.

Next, a photolithography process is performed to form a photoresist pattern on the substrate 203 of the semiconductor layer 206 as shown in FIG. 4. Next, an ion implantation process is performed using the photoresist pattern as a mask to implant the dopant having the first conduction type into a portion of the semiconductor layer 206. Therefore, the first well doped region 210 is formed in the semiconductor layer 206. Next, the photoresist pattern is removed.

Next, another photolithography process is performed to form another photoresist pattern on the substrate 203 of the semiconductor layer 206. Next, another ion implantation process is performed using the photoresist pattern as a mask to implant the dopant having the second conduction type into portions of the semiconductor layer 206. Therefore, the second well doped region 208 and the third well doped region 212 are formed in portions of the semiconductor layer 206, which are close to two opposite sides 210a and 210b of the first well doped region 210. Next, the photoresist pattern is removed. Because the conduction type of the second well doped region 208 is the same as that of the third well doped region 212, the second well doped region 208 and the third well doped region 212 may be formed during a single ion implantation process. In some embodiments, the sequence of the ion implantation process of forming the first well doped region 210, and the ion implantation process of forming the second well doped region 208 and the third well doped region 212, can be exchanged.

Figure 5:
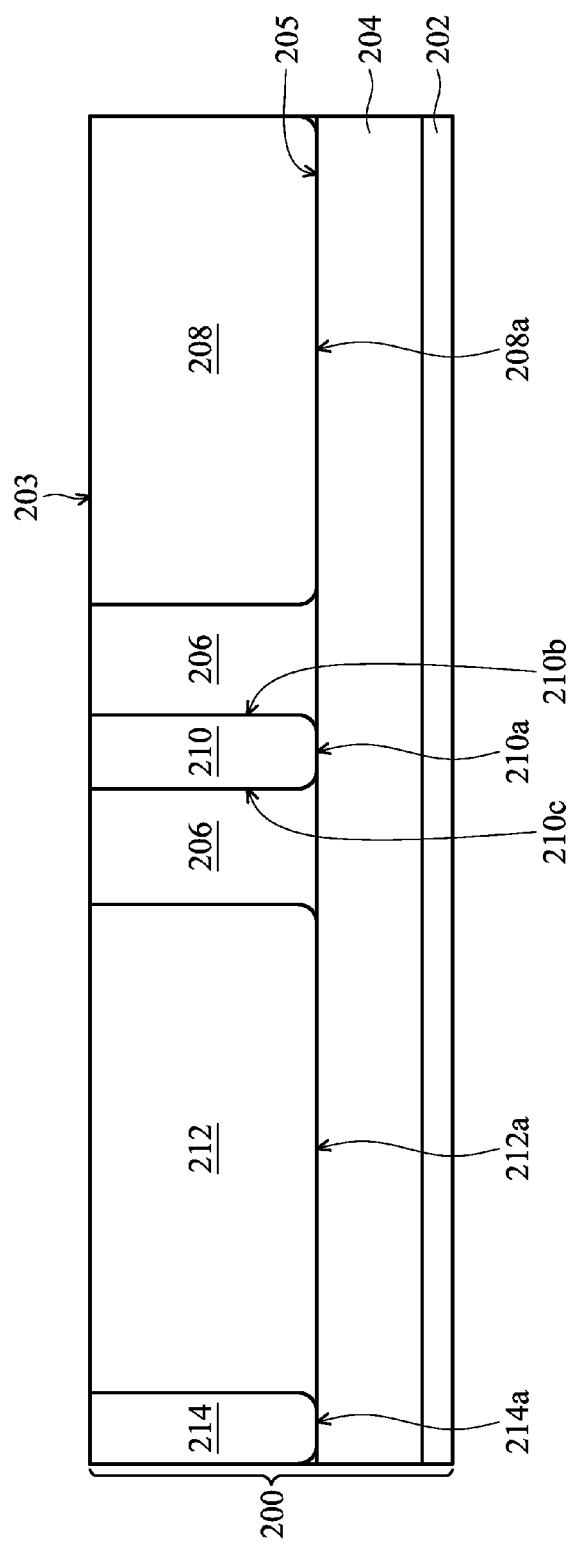
FIG. 5 is cross-sectional views showing a method for fabricating a semiconductor device in accordance with some embodiments of the disclosure.

Next, another photolithography process is performed to form another photoresist pattern on the substrate 203 of the semiconductor layer 206 as shown in FIG. 5. Next, another ion implantation process is performed using the photoresist pattern as a mask to implant the dopant having the second conduction type into a portion of the semiconductor layer 206, which is positioned at a side of the third well doped region 212. Also, the side of the third well doped region 212 is away from the first well doped region 210. Therefore, the fourth well doped region 214 adjacent to the third well doped region 212 is formed. Next, the photoresist pattern is removed. In some embodiments, the dopant concentration of the fourth well doped region 214 is greater than that of the third well doped region 212.

Figure 6:
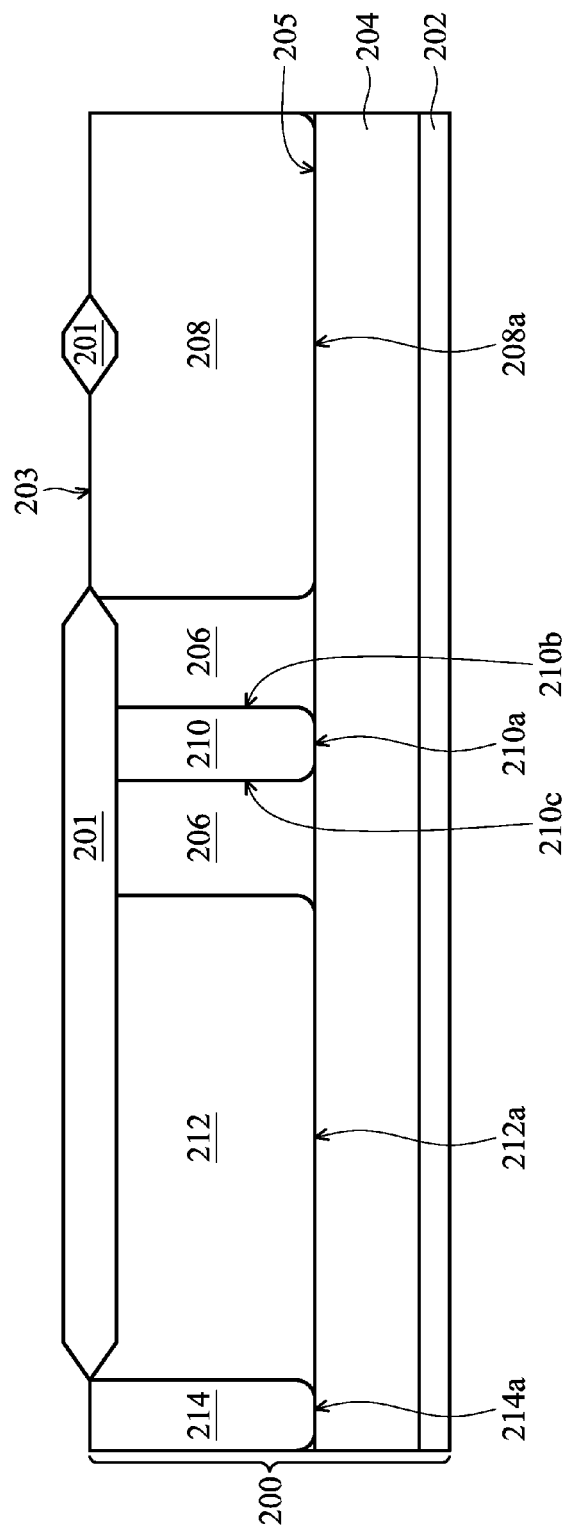
FIG. 6 is cross-sectional views showing a method for fabricating a semiconductor device in accordance with some embodiments of the disclosure.

Next, a local oxidation of silicon (LOCOS) process or a shallow trench isolation (STI) process is performed to form one or more isolation features 201 on the surface 203 of the semiconductor layer 206 as shown in FIG. 6. The active regions of the semiconductor device 500a are defined by the isolation features 201. In some embodiments, the second well doped region 208 and fourth well doped region 214 are exposed from the isolation feature 201.

Figure 7:
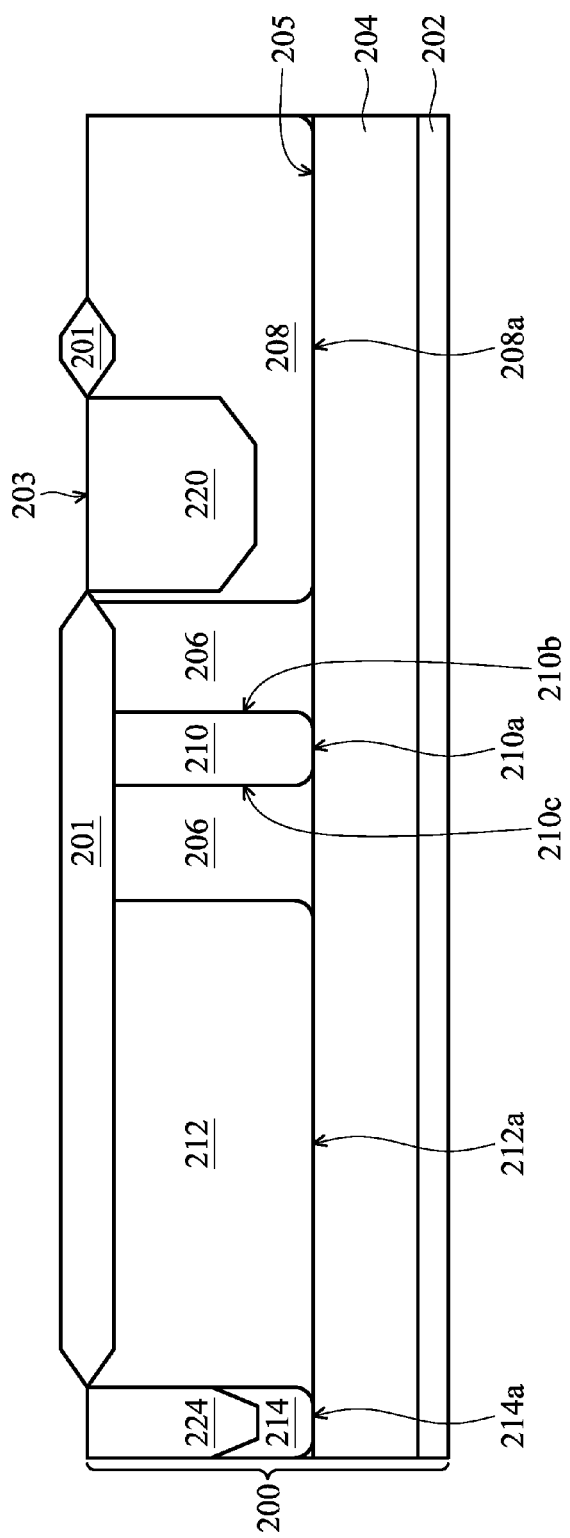
FIG. 7 is cross-sectional views showing a method for fabricating a semiconductor device in accordance with some embodiments of the disclosure.

Next, yet another photolithography process is performed to form yet another photoresist pattern on the substrate 203 of the semiconductor layer 206 as shown in FIG. 7. Next, yet another ion implantation process is performed using the photoresist pattern as a mask to implant the dopant having the first conduction type into a portion of the second well doped region 208. Therefore, the third anode doped region 220 is formed. Next, the photoresist pattern is removed.

Next, yet another photolithography process is performed to form yet another photoresist pattern on the substrate 203 of the semiconductor layer 206. Next, yet another ion implantation process is performed using the photoresist pattern as a mask to implant the dopant having the second conduction type into a portion of the fourth well doped region 214. Therefore, the second cathode doped region 224 is formed. Next, the photoresist pattern is removed. In some embodiments, the sequence of the ion implantation processes of forming the third anode doped region 220 and the second cathode doped region 224 can be exchanged. In some embodiments, a bottom boundary of the third anode doped region 220 is positioned within the second well doped region 208. Also, a bottom boundary of the second cathode doped region 224 is positioned within the fourth well doped region 214.

Figure 8A:
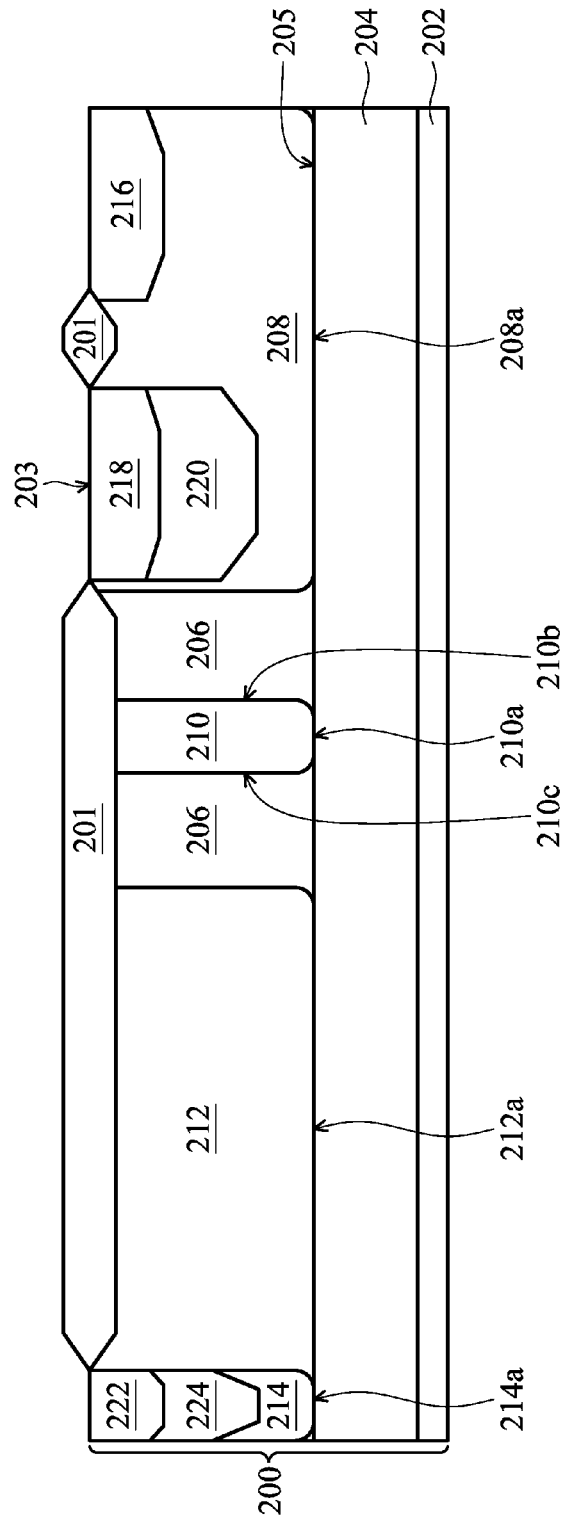
FIGS. 8A-8B are cross-sectional views showing a method for fabricating a semiconductor device in accordance with some embodiments of the disclosure.

Next, several photolithography processes and subsequent ion implantation processes are performed to form the first anode doped region 216, which has the second conduction type, and the second anode doped region 218, which has the first conduction type, on a portion of the second well doped region 208 as shown in FIG. 8A. Also, the first cathode doped region 222, which has the second conduction type, is also formed on a portion of the fourth well doped region 214. Because the conduction type and the dopant concentration of the first anode doped region 216 are the same as those the first cathode doped region 222. The first anode doped region 216 and the first cathode doped region 222 may be formed during a single ion implantation process. In some embodiments, a bottom boundary of the first anode doped region 216 is positioned within the second well doped region 208. A bottom boundary of the second anode doped region 218 is positioned within the third anode doped region 220. Also, a bottom boundary of the first cathode doped region 222 is positioned within the second cathode doped region 224.

Next, an interconnection process is performed to form the anode electrode 226, which is coupled to the first anode doped region 216, the second anode doped region 218 and the third anode doped region 220, on the SOI substrate 200 as shown in FIG. 1A. Additionally, the cathode electrode 228, which is coupled to the first cathode doped region 222 and the second cathode doped region 224, is formed on the SOI substrate 200. After performing the aforementioned processes, the semiconductor device 500a is completely formed.

In some other embodiments, a plurality strip-shape photoresist patterns can be used for the subsequent ion implantation processes to form the second well doped region 208, which is composed by a plurality of strip-shaped second sub-well doped regions 208-1, 208-2, 208-3, 208-4 and 208-5 separated from each other as shown in FIG. 1B, during the formation of the second well doped region 208 as shown in FIG. 4. Also, a plurality strip-shape photoresist patterns can be used for the subsequent ion implantation processes to form the third well doped region 212, which is composed by a plurality of strip-shaped third sub-well doped regions 212-1, 212-2, 212-3, 212-4 and 212-5 separated from each other as shown in FIG. 1B, during the formation of the third well doped region 212 as shown in FIG. 4. Next, the processes shown in FIGS. 5-7 and 8 are performed to form the fourth well doped region 214, the first anode doped region 216, the second anode doped region 218, the third anode doped region 220, the first cathode doped region 222 and the second cathode doped region 224. Finally, an interconnection process is performed to form the anode electrode 226, which is coupled to the first anode doped region 216, the second anode doped region 218 and the third anode doped region 220, on the SOI substrate 200 as shown in FIG. 1B. Additionally, the cathode electrode 228, which is coupled to the first cathode doped region 222 and the second cathode doped region 224, is formed on the SOI substrate 200. After performing the aforementioned processes, the semiconductor device 500b is completely formed.

Figure 2A:
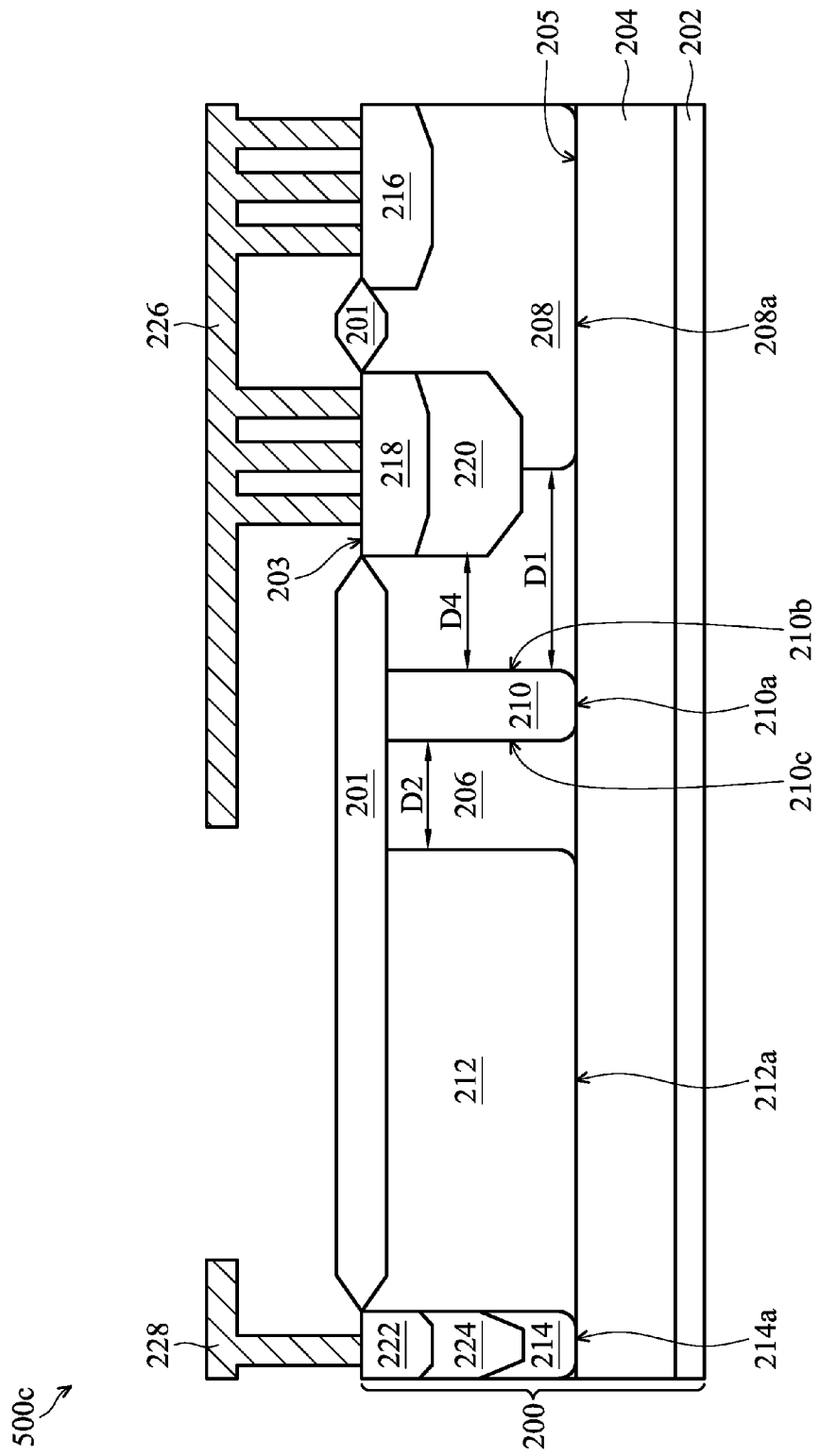
FIG. 2A is a cross-sectional view of a semiconductor device in accordance with some embodiments of the disclosure.
Figure 2B:
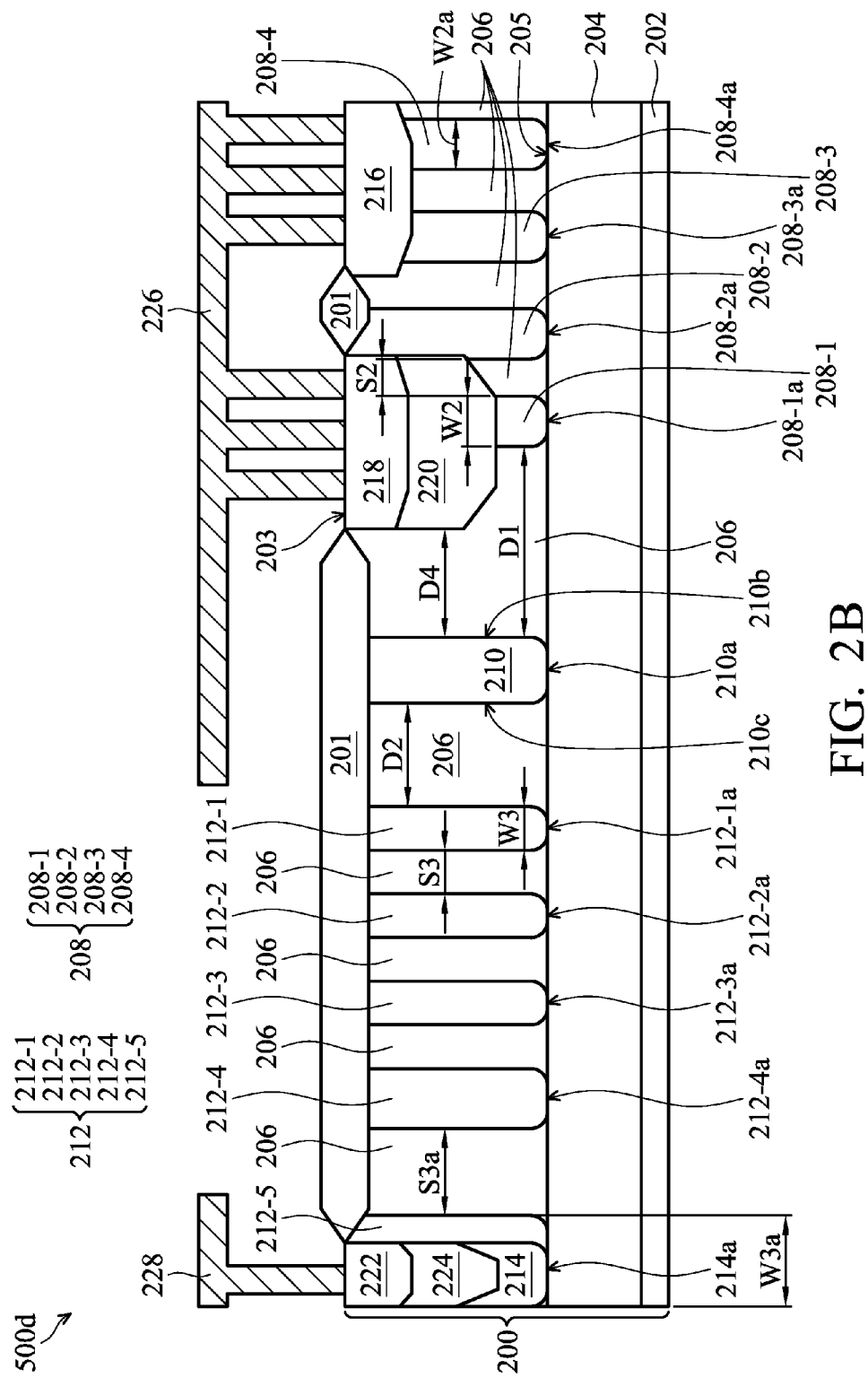
FIG. 2B is a cross-sectional view of a semiconductor device in accordance with some embodiments of the disclosure.
Figure 2C:
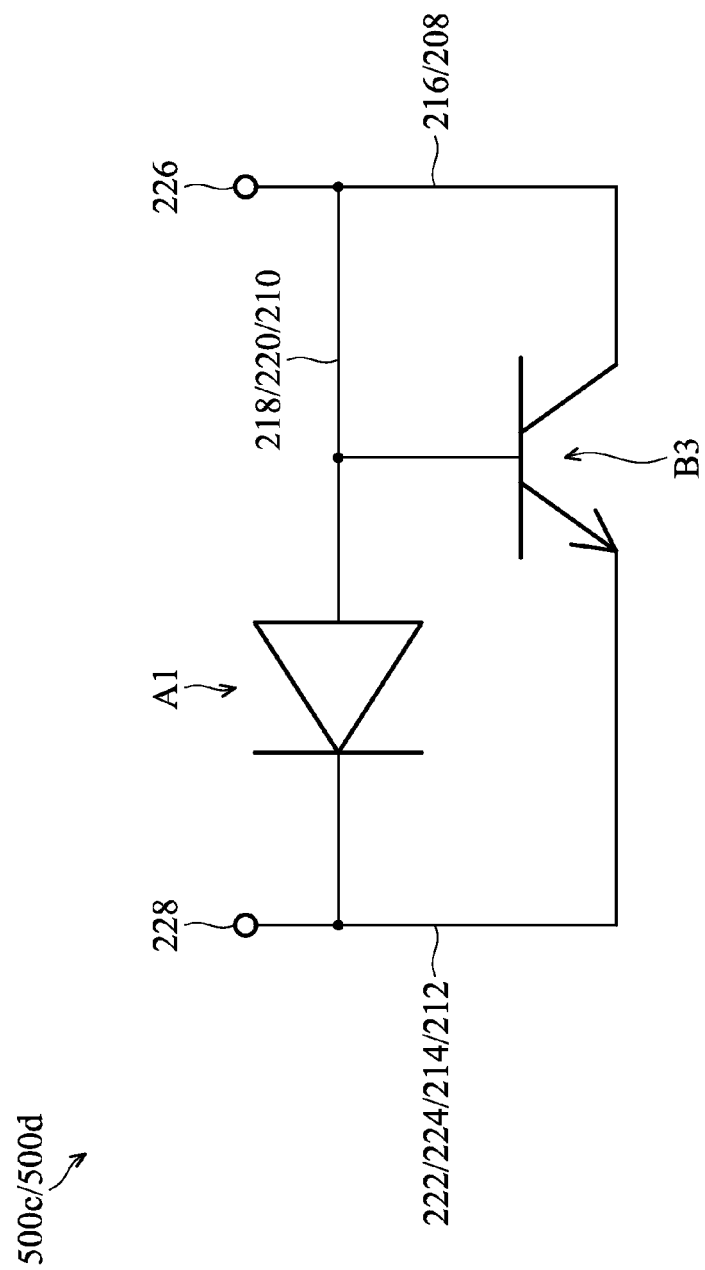
FIG. 2C is an equivalent circuit diagram shown in FIGS. 2A and 2B.

FIGS. 2A and 2B are cross-sectional views of semiconductor devices 500c and 500d in accordance with some embodiments of the disclosure. FIG. 2C is an equivalent circuit diagram shown in FIGS. 2A and 2B. Elements of the embodiments hereinafter, that are the same or similar as those previously described with reference to FIGS. 1A-1C, are not repeated for brevity.

One of the differences between the semiconductor device 500c as shown in FIG. 2A and the semiconductor device 500a as shown in FIG. 1A is: the second anode doped region 218 and the third anode doped region 220 of the semiconductor device 500b partially overlap the second well doped region 208. Also, the second anode doped region 218 is separated from the first well doped region 210 by a fourth distance D4. In this embodiment, portions of the second anode doped region 218 and the third anode doped region 220, which are outside to the boundary of the second well doped region 208, are positioned in the semiconductor layer 206 and lateral (substantially parallel to the surface 203 of the semiconductor layer 206) between the first well doped region 210 an the second well doped region 208. Therefore, the fourth distance D4 is greater than the first distance D1.

One of the differences between the semiconductor device 500d as shown in FIG. 2B and the semiconductor device 500b as shown in FIG. 1B is similar to the difference between the semiconductor device 500c and the semiconductor device 500a. Additionally, one of the differences between the semiconductor device 500d and the semiconductor device 500c is similar to the difference between the semiconductor devices 500b and 500a. The differences are not repeated for brevity.

FIG. 2C is an equivalent circuit diagram of the semiconductor devices 500c and 500d in accordance with some embodiments of the disclosure shown in FIGS. 2A and 2B. As shown in FIGS. 2A and 2C, the first anode doped region 216, the second anode doped region 218, the third anode doped region 220, the second well doped region 208, the first well doped region 210, the third well doped region 212, the fourth well doped region 214, the first cathode doped region 222 and the second cathode doped region 224 of the semiconductor device 500c or the semiconductor device 500d collectively form a third bipolar junction transistor B3. The first anode doped region 216d the second well doped region 208 serve as a collector of the third bipolar junction transistor B3. The second anode doped region 218, the third anode doped region 220 and the first well doped region 210 serve as a base of the third bipolar junction transistor B3. Also, the third well doped region 212, the fourth well doped region 214, the first cathode doped region 222 and the second cathode doped region 224 serve as an emitter of the of the third bipolar junction transistor B3. In some embodiments, when the first conduction type is p-type, and the second conduction type is n-type, the third bipolar junction transistor B3 may serve as a PNP bipolar junction transistor.

As shown in FIGS. 2A and 2C, the second anode doped region 218, the third anode doped region 220, the first well doped region 210, the second well doped region 208, the third well doped region 212, the fourth well doped region 214, the first cathode doped region 222 and the second cathode doped region 224 of the semiconductor device 500c or the semiconductor device 500d may collectively form a (parasitic) diode A1. The second anode doped region 218, the third anode doped region 220 and the first well doped region 210 may serve as a first electrode of the diode A1. The third well doped region 212 and the first cathode doped region 222 may serve as a second electrode of the diode A1. The base of the third bipolar junction transistor B3 is coupled to the first electrode of the diode A1, and the emitter of the of the third bipolar junction transistor B3 is coupled to the second electrode of the diode A1. In some embodiments, when the first conduction type is p-type, and the second conduction type is n-type, the third bipolar junction transistor B3 may serve as a PNP bipolar junction transistor, and the first electrode of the diode A1 may serve as an anode (p-electrode) of the diode. The second electrode may serve as a cathode (n-electrode) of the diode A1.

Therefore, the first anode doped region 216, the second anode doped region 218, the third anode doped region 220, the first well doped region 210, the third well doped region 212, the fourth well doped region 214, the first cathode doped region 222 and the second cathode doped region 224 of the semiconductor device 500c or the semiconductor device 500d may collectively form a diode. The diode is formed by another diode, which is composed of the base and the emitter of the third bipolar junction transistor B3, and the (parasitic) diode A1, which are connected in parallel. As shown in FIG. 2C, the second anode doped region 218, the third anode doped region 220, the first well doped region 210, which are coupled to the anode electrode 226, may serve as a first electrode of the diode. The third well doped region 212, the fourth well doped region 214, the first cathode doped region 222 and the second cathode doped region 224, which are coupled to the cathode electrode 228, may serve as a second electrode of the diode. In some embodiments, when the first conduction type is p-type, and the second conduction type is n-type, the second anode doped region 218, the third anode doped region 220, the first well doped region 210, which are coupled to the anode electrode 226, may serve as an anode (p-electrode) of the diode. The third well doped region 212, the fourth well doped region 214, the first cathode doped region 222 and the second cathode doped region 224, which are coupled to the cathode electrode 228, may serve as a cathode (n-electrode) of the diode.

Figure 8B:
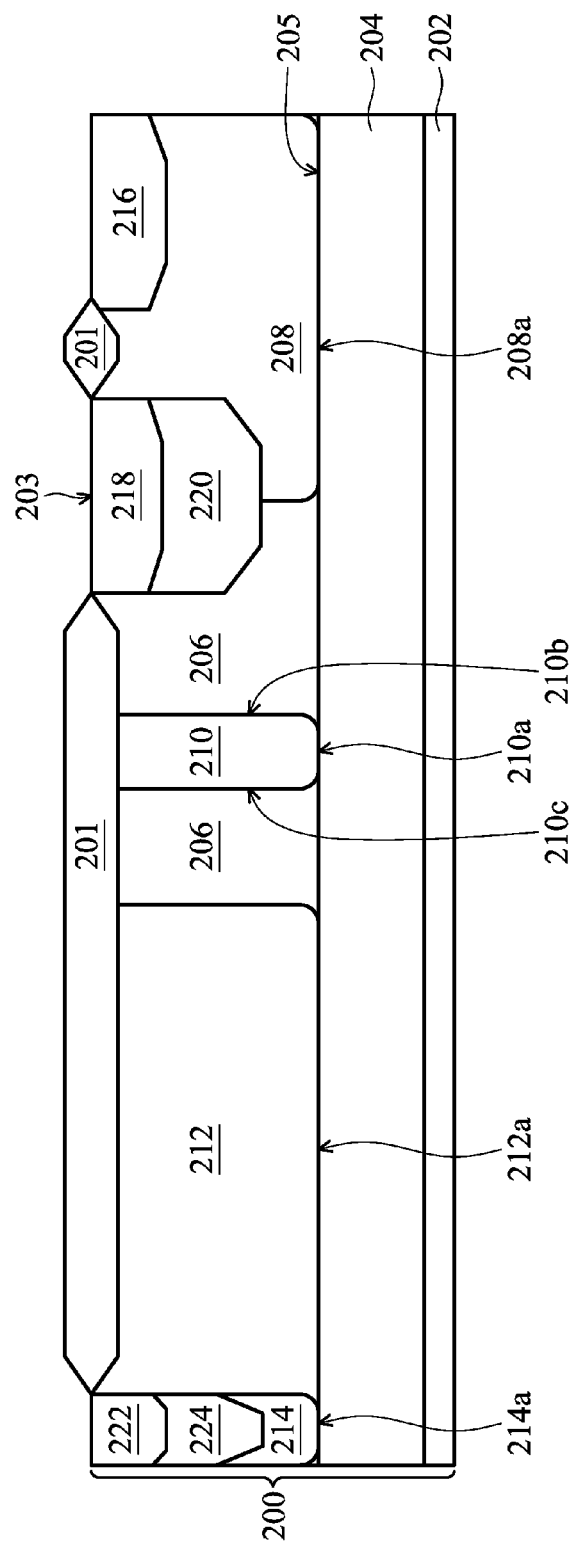

FIGS. 3-7 and 8B are cross-sectional views showing a method for fabricating the semiconductor device 500c in accordance with some embodiments of the disclosure. Elements of the embodiments hereinafter, that are the same or similar as those previously described with reference to FIGS. 3-7 and 8A, are not repeated for brevity. One of the differences between the semiconductor devices 500c and 500a is illustrated in FIG. 8B. As shown in FIG. 8B, several photolithography processes and subsequent ion implantation processes are performed to form the first anode doped region 216, which has the second conduction type, and the second anode doped region 218, which has the first conduction type, on a portion of the second well doped region 208. Also, the first cathode doped region 222, which has the second conduction type, is also formed on a portion of the fourth well doped region 214. In this embodiment, the second anode doped region 218 and the third anode doped region 220 partially overlap the second well doped region 208. Because the conduction type and the dopant concentration of the first anode doped region 216 are the same as those of the first cathode doped region 222. The first anode doped region 216 and the first cathode doped region 222 may be formed during a single ion implantation process. In some embodiments, a bottom boundary of the first anode doped region 216 is positioned within the second well doped region 208. A bottom boundary of the second anode doped region 218 is positioned within the third anode doped region 220. Also, a bottom boundary of the first cathode doped region 222 is positioned within the second cathode doped region 224. Finally, an interconnection process is performed to form the anode electrode 226 and the cathode electrode 228 on the SOI substrate 200. After performing the aforementioned processes, the semiconductor device 500c is completely formed.

In some other embodiments, during the formation of the second well doped region 208 and the third well doped region 212 shown in FIG. 4, a plurality of strip-shaped photoresist patterns can be used as a mask for the subsequent ion implantation processes to form the second well doped region 208, which is composed of a plurality of strip-shaped second sub-well doped regions 208-1, 208-2, 208-3, 208-4 and 208-5 separated from each other, and the third well doped region 212, which is composed of a plurality of strip-shaped third sub-well doped regions 212-1, 212-2, 212-3, 212-4 and 212-5 separated from each other. Next, the processes shown in FIGS. 5-7, 8B are performed in sequence. Finally, an interconnection process is performed to form the anode electrode 226 and the cathode electrode 228 on the SOI substrate 200. After performing the aforementioned processes, the semiconductor device 500d is completely formed.

The semiconductor devices 500a-500d in accordance with some embodiments of the disclosure have the following advantages. The semiconductor device is a lateral fast recovery diode formed by one or more lateral bipolar junction transistors (BJTs). For example, each of the semiconductor devices 500a-500b is a lateral fast recovery diode composed of a PNP BJT (e.g. the first bipolar junction transistor B1 show in FIG. 1C) and a NPN BJT (e.g. the second bipolar junction transistor B2 show in FIG. 1C), which is laterally coupled to the PNP BJT. When the semiconductor devices 500a-500b are supplied a forward bias, the NPN BJT may increase the turn-on current of the NPN BJT. Therefore, the semiconductor devices 500a-500b can achieve the goal of the large forward current. When the semiconductor devices 500a-500b are supplied a reverse bias, the lateral fast recovery diode may quickly cut off the reverse current, thereby effectively reducing the reverse recovery time (tRR) of the semiconductor device devices 500a-500b. Additionally, each of the semiconductor devices 500c-500d is a lateral fast recovery diode composed of NPN BJT (e.g. the second bipolar junction transistor B3 show in FIG. 2C) and a (parasitic) diode A1, which is laterally coupled to the NPN BJT. When the semiconductor devices 500c-500d are supplied a forward bias, the NPN BJT may increase the turn-on current of the diode. When the semiconductor devices 500c-500d are supplied a reverse bias, the lateral fast recovery diode may quickly cut off the reverse current, thereby effectively reducing the reverse recovery time (tRR) of the semiconductor device devices 500c-500d. The area of the semiconductor device can be significantly reduced and the driving ability of the current is increased. The semiconductor device is formed on a silicon on insulator (SOT) substrate, thereby compressing the latch-up effect generated by a parasitic bipolar junction transistor (BJT). The SOI substrate can prevent the semiconductor device from experiencing the latch-up effect, and it can also prevent leakage current. Additionally, the second well doped region, which is coupled to the anode electrode, and the third well doped region, which is coupled to the cathode electrode, are respectively composed of a plurality of strip-shaped sub-well doped regions separated from each other. Therefore, the total dopant concentrations of the second well doped region and the third well doped region can be reduced while improving the high-voltage endurance of the semiconductor device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate;
   a buried oxide layer disposed on the substrate;
   a semiconductor layer having a first conduction type disposed on the buried oxide layer;
   a first well doped region having the first conduction type disposed in the semiconductor layer;
   a second well doped region and a third well doped region having a second conduction type opposite to the first conduction type, disposed close to opposite sides of the first well doped region, wherein the second well doped region and the third well doped region are separated from the first well region by a first distance and a second distance;
   a first anode doped region having the second conduction type disposed on the second well doped region;
   a second anode doped region having the first conduction type disposed on the second well doped region;
   a third anode doped region having the first conduction type disposed on the second well doped region, wherein the second anode doped region is positioned directly on the third anode doped region; and
   a first cathode doped region having the second conduction type coupled to the third well doped region.

2. The semiconductor device as claimed in claim 1, further comprising:
   a fourth well doped region, wherein the fourth well doped region is adjacent to a side of the third well doped region, which is away from a side of the first well doped region.

3. The semiconductor device as claimed in claim 2, further comprising:
   a second cathode doped region having the second conduction type, wherein the first cathode doped region and the second cathode doped region are disposed on the fourth well doped region, wherein the first cathode doped region is positioned directly on the second cathode doped region.

4. The semiconductor device as claimed in claim 1, wherein a dopant concentration of the second anode doped region is greater than that of the third anode doped region.

5. The semiconductor device as claimed in claim 3, wherein a dopant concentration of the first cathode doped region is greater than that of the second cathode doped region, and the dopant concentration of the of the second cathode doped region is greater than that of the fourth well doped region.

6. The semiconductor device as claimed in claim 1, wherein the second anode doped region and the third anode doped region partially overlap the second well doped region.

7. The semiconductor device as claimed in claim 6, wherein the second anode doped region is separated from the first well doped region by a third distance that is shorter than the first distance.

8. The semiconductor device as claimed in claim 1, wherein a boundary of the second anode doped region is separated from the buried oxide layer.

9. The semiconductor device as claimed in claim 1, wherein the second anode doped region is separated from the first well doped region by a fourth distance that is shorter than the first distance.

10. The semiconductor device as claimed in claim 1, wherein the second well doped region is composed by a plurality of strip-shaped second sub-well doped regions separated from each other, and wherein the strip-shaped second sub-well doped regions extend from a surface of the semiconductor layer down to the buried oxide layer.

11. The semiconductor device as claimed in claim 2, wherein the third well doped region is composed by a plurality of strip-shaped third sub-well doped regions, and wherein the strip-shaped third sub-well doped regions extend from a surface of the semiconductor layer down to the buried oxide layer.

12. The semiconductor device as claimed in claim 11, wherein one of the strip-shaped third sub-well doped regions is adjacent to the fourth well doped region and separated from another of the strip-shaped third sub-well doped regions adjacent thereto by a first space, and the first space is greater than a width of each of the strip-shaped third sub-well doped regions.

13. The semiconductor device as claimed in claim 1, wherein the first anode doped region, the second anode doped region and the third anode doped region are coupled to an anode electrode.

14. The semiconductor device as claimed in claim 1, wherein the first cathode doped region is coupled to a cathode electrode.

15. The semiconductor device as claimed in claim 1, wherein the second anode doped region, the third anode doped region, the second well doped region and the first well doped region collectively form a first bipolar junction transistor, wherein the second anode doped region and the third anode doped region serve as a collector of the first bipolar junction transistor, the second well doped region serves as a base of the first bipolar junction transistor, and the first well doped region serves as an emitter of the first bipolar junction transistor.

16. The semiconductor device as claimed in claim 15, wherein the second well doped region, the first well doped region, the third well doped region and the first cathode doped region collectively form a second bipolar junction transistor, wherein the second well doped region serves as a collector of the second bipolar junction transistor, the first well doped region serves as a base of the second bipolar junction transistor, and the third well doped region and the first cathode doped region serve as an emitter of the second bipolar junction transistor.

17. The semiconductor device as claimed in claim 16, wherein the base of the first bipolar junction transistor is coupled to the collector of the second bipolar junction transistor, and the emitter of the first bipolar junction transistor is coupled to the collector of the second bipolar junction transistor.

18. The semiconductor device as claimed in claim 16, wherein the second anode doped region, the third anode doped region, the first well doped region, the third well doped region and the first cathode doped region collectively form a diode, wherein the second anode doped region, the third anode doped region and the first well doped region serve as a first electrode, and the third well doped region and the first cathode doped region serve as a second electrode.

19. The semiconductor device as claimed in claim 16, wherein the first conduction type is p-type and the second conduction type is n-type, the first bipolar junction transistor is a PNP bipolar junction transistor, and the second bipolar junction transistor is a NPN bipolar junction transistor.

20. The semiconductor device as claimed in claim 7, wherein the second well doped region, the first well doped region, the third well doped region and the first cathode doped region collectively form a third bipolar junction transistor, wherein the second well doped region serves as a collector of the third bipolar junction transistor, the first well doped region serves as a base of the third bipolar junction transistor, and the third well doped region and the first cathode doped region serve as an emitter of the third bipolar junction transistor.

21. The semiconductor device as claimed in claim 20, wherein the second anode doped region, the third anode doped region, the first well doped region, the third well doped region and the first cathode doped region collectively form a diode, wherein the second anode doped region, the third anode doped region and the first well doped region serve as a first electrode, and the third well doped region and the first cathode doped region serve as a second electrode.

22. The semiconductor device as claimed in claim 21, wherein the base of the third bipolar junction transistor is coupled to the first electrode of the diode, the emitter of the third bipolar junction transistor is coupled to the second electrode of the diode.

23. The semiconductor device as claimed in claim 21, wherein the first conduction type is p-type and the second conduction type is n-type, the third bipolar junction transistor is a NPN bipolar junction transistor, and the first electrode and the second electrode of the diode are respectively an anode and a cathode.

24. The semiconductor device as claimed in claim 1, wherein the first well doped region and the third well dope region are covered by an isolation feature.

* * * * *